(12) United States Patent
Becker

(10) Patent No.: US 6,659,630 B2
(45) Date of Patent: Dec. 9, 2003

(54) CONTACTLESS VEHICLE LAMP SWITCH

(75) Inventor: David L. Becker, White Lake, MI (US)

(73) Assignee: TRW Inc., Lyndhurst, OH (US)

( * ) Notice: Subject to any disclaimer, the term of this patent is extended or adjusted under 35 U.S.C. 154(b) by 0 days.

(21) Appl. No.: 09/851,953

(22) Filed: May 9, 2001

(65) Prior Publication Data

US 2002/0167815 A1 Nov. 14, 2002

(51) Int. Cl.[7] .............................. B60Q 1/00; B60Q 1/26
(52) U.S. Cl. ....................... 362/501; 362/802; 362/295; 362/394; 335/205
(58) Field of Search ................................. 362/501, 295, 362/394, 802; 324/207.2, 207.21, 207.25; 335/207, 205, 206; 200/61.43, 564

(56) References Cited

U.S. PATENT DOCUMENTS

| | | |
|---|---|---|
| 4,088,977 A | 5/1978 | Bowman, Jr. et al. |
| 4,247,601 A | 1/1981 | Wiegand |
| 4,371,762 A * | 2/1983 | Diamond .................. 200/61.43 |
| 4,524,248 A | 6/1985 | Levko |
| 5,705,778 A * | 1/1998 | Matsui et al. .............. 200/11 R |
| 5,754,042 A * | 5/1998 | Schroeder et al. ...... 324/207.21 |
| 5,959,267 A * | 9/1999 | Kawasaki et al. .............. 200/4 |
| 6,097,272 A * | 8/2000 | Grover et al. ............... 200/526 |
| 6,100,476 A * | 8/2000 | Adamietz et al. ............... 200/4 |
| 6,175,290 B1 * | 1/2001 | Forsythe et al. ............. 335/205 |

OTHER PUBLICATIONS

An article entitled Wiegand Effect Sensors Theory and Applications, by Dlugos, HID Corp. dated Apr. 21, 2001, pp. 1–5.

* cited by examiner

Primary Examiner—Stephen Husar
Assistant Examiner—Sharon Payne
(74) Attorney, Agent, or Firm—Tarolli, Sundheim, Covell & Tummino L.L.P.

(57) ABSTRACT

A switch (10) for controlling operation of vehicle lamps (e.g., 16) comprises a base (30) and a manually engageable assembly (50) rotatable about an axis (32) relative to the base for controlling operation of the lamps. The assembly (50) comprises a magnetic member (56) that rotates with the assembly about the axis (32). The base (30) comprises at least one magnetic sensor (e.g., 40–44) and control circuitry connecting the sensor with the vehicle lamps (e.g., 16). The magnetic member (56) is rotatable about the axis (32) into a plurality of different rotational positions relative to the sensor (e.g., 40–44) to provide an output signal at the control circuitry (70) that is indicative of the relative rotational position of the assembly (50). The magnetic member (56) is spaced apart from the base (30) to provide contactless operation of the switch (10).

18 Claims, 2 Drawing Sheets

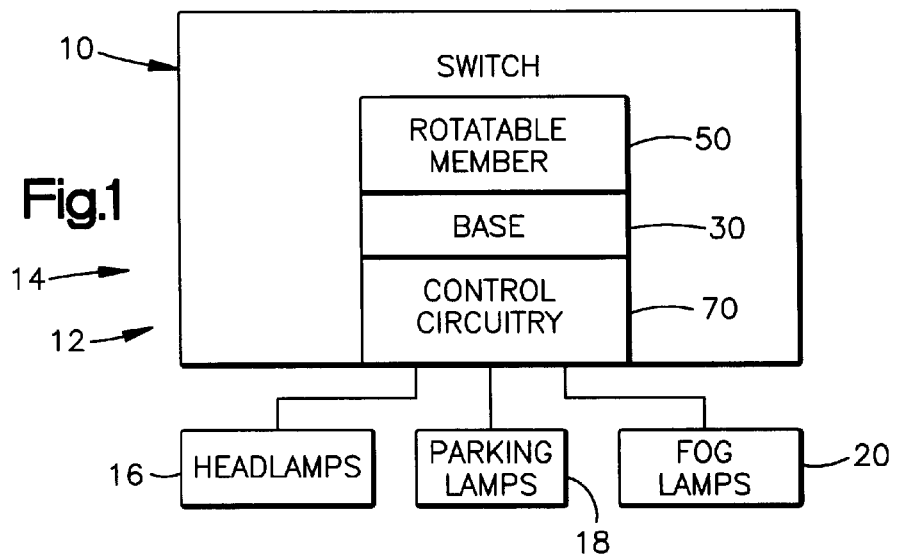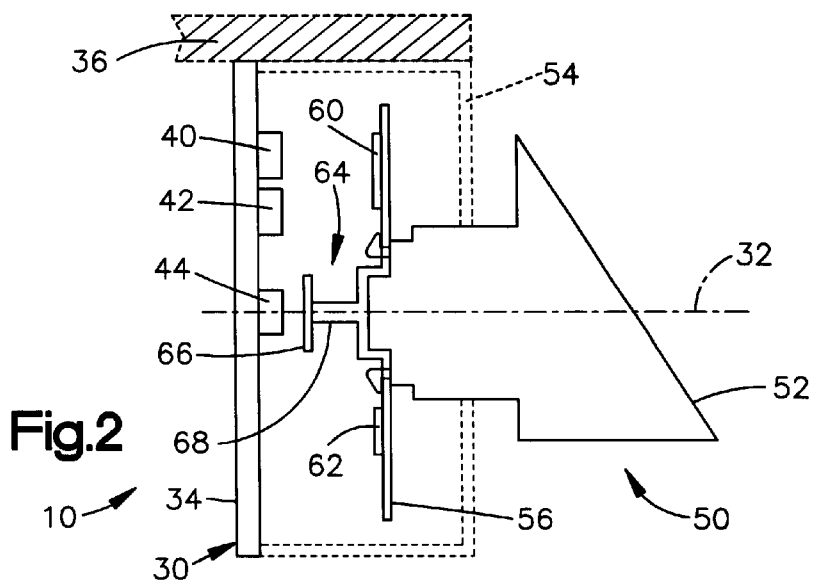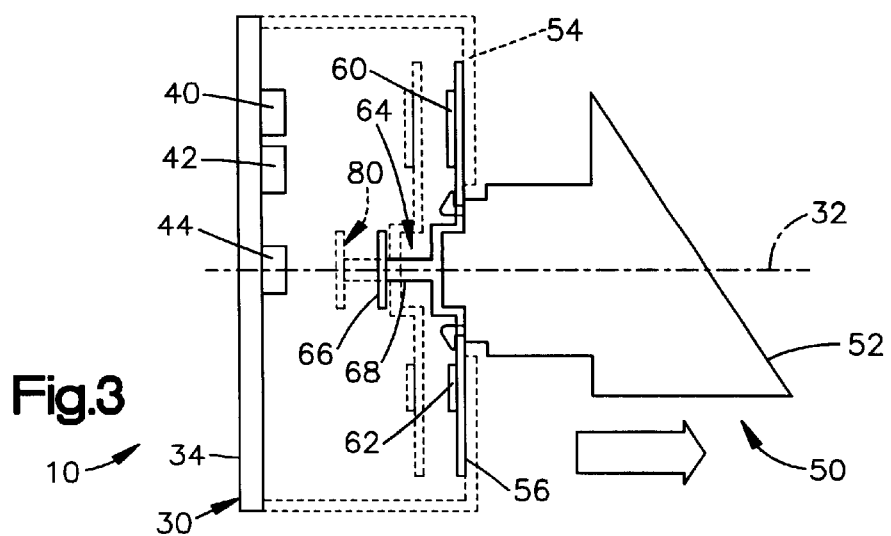

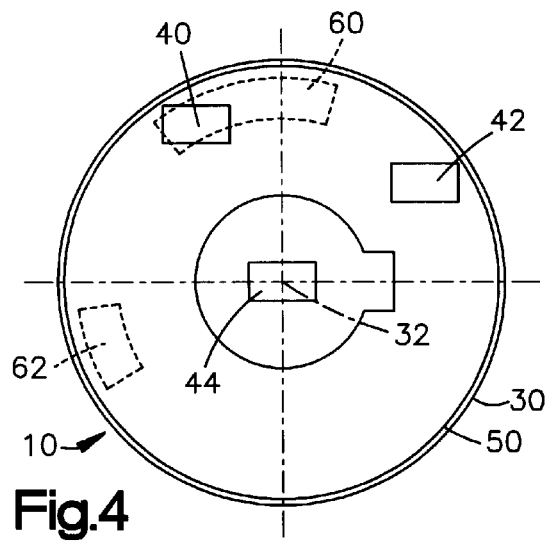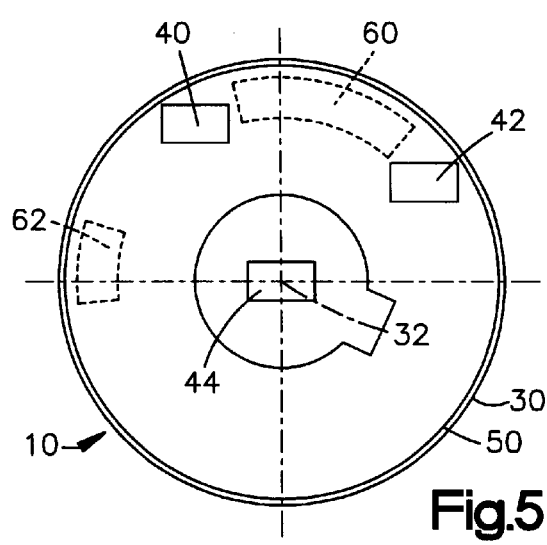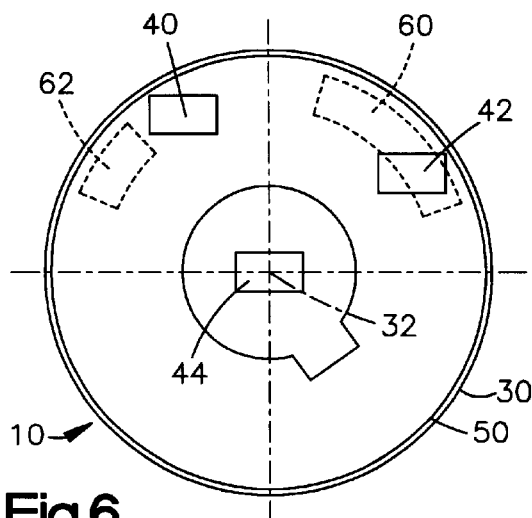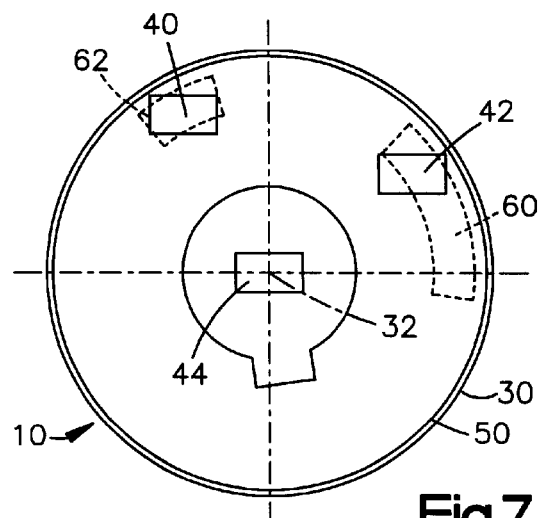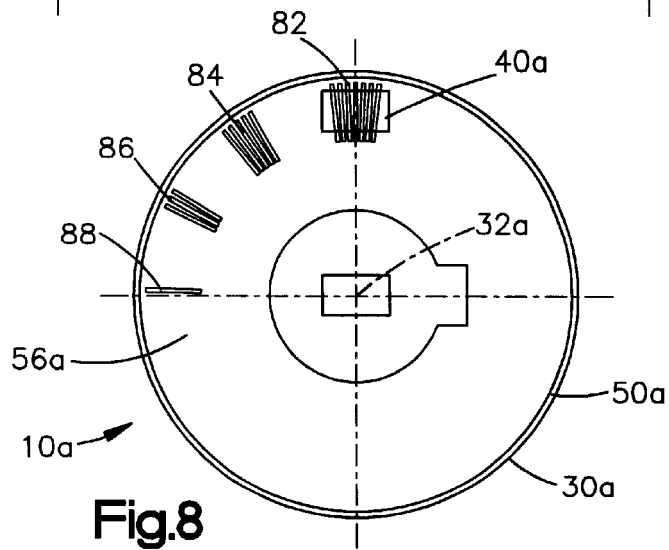

CONTACTLESS VEHICLE LAMP SWITCH

BACKGROUND OF THE INVENTION

The present invention relates to a vehicle lamp switch. In particular, the present invention relates to a vehicle lamp switch that operates in a contactless manner to control operation of the vehicle headlamps, parking lamps, and fog lamps.

DESCRIPTION OF RELATED ART

A typical vehicle lamp switch includes a rotary control having at least three positions: all (parking lamps and headlamps) OFF, parking lamps ON, and all ON. The lamp switch may also incorporate an autolamp function, and two pull-on functions for turning ON fog lamps. The typical lamp switch includes mechanically engageable contacts for controlling all these functions.

Also known in other applications are contactless switches. Such switches may operate by rotating a magnet past a fixed magnetic sensor, such as a Hall effect IC or a magnetoresistive sensor. It is also known to make a contactless switch that operates using the Wiegand effect.

SUMMARY OF THE INVENTION

The present invention is an apparatus comprising a switch for controlling operation of lamps of a vehicle. The switch comprises a base, and a manually engageable assembly rotatable about an axis relative to the base for controlling operation of the vehicle lamps. The assembly comprises a magnetic member that rotates with the assembly about the axis. The base comprises at least one magnetic sensor and control circuitry connecting the one magnetic sensor with the vehicle lamps. The magnetic member is rotatable about the axis into a plurality of different rotational positions relative to the one magnetic sensor to provide an output signal at the control circuitry that is indicative of the relative rotational position of the assembly. The magnetic member is spaced apart from the base to provide contactless operation of the switch.

BRIEF DESCRIPTION OF THE DRAWINGS

The foregoing and other features and advantages of the invention will become apparent to one skilled in the art to which the invention relates upon consideration of the following description of the invention with reference to the accompanying drawings, in which:

FIG. 1 is a block diagram of an apparatus including a switch in accordance with a first embodiment of the invention;

FIG. 2 is a side view of the switch of FIG. 1, shown in a first condition;

FIG. 3 is a view similar to FIG. 2 showing the switch in a second condition;

FIG. 4 is a schematic view showing parts of the switch in a first rotational position;

FIG. 5 is a view similar to FIG. 4 showing parts of the switch in a second rotational position;

FIG. 6 is a view similar to FIG. 4 showing parts of the switch in a third rotational position;

FIG. 7 is a view similar to FIG. 4 showing parts of the switch in a fourth rotational position; and FIG. 8 is a schematic view showing parts of a switch in accordance with a second embodiment of the invention.

DESCRIPTION OF EXAMPLE EMBODIMENTS

The present invention relates to a vehicle lamp switch. In particular, the invention relates to a vehicle lamp switch that operates in a contactless manner to control operation of the vehicle parking lamps, headlamps, and fog lamps. As representative of the present invention, FIG. 1 illustrates schematically a switch 10 in accordance with a first embodiment of the present invention. The switch 10 forms part of a lighting system 12 for a vehicle 14. The lighting system 12 includes, in addition to the switch 10, headlamps 16, parking lamps 18, and fog lamps 20 of the vehicle 14.

The switch 10 includes a base 30 (FIG. 2) and a movable assembly 50. The movable assembly 50 is manually engageable by an occupant (not shown, e.g., a driver) of the vehicle to cause movement of the assembly. Movement of the assembly 50 includes rotation about an axis 32 relative to the base 30, and movement along the axis relative to the base. The movements of the movable assembly 50 control, in a manner described below, energization of the headlamps 16, parking lamps 18, and fog lamps 20.

The base 30, or fixed portion of the switch 10, includes a substrate 34. The substrate 34 is preferably a printed circuit (PC) board fixed to the vehicle instrument panel 36 (shown schematically and in phantom). It should be understood that the base 30 could have a different configuration or construction.

The base 30 includes a plurality of sensors mounted on the PC board 34. In the illustrated embodiment, three sensors 40, 42, and 44 are provided. The three sensors 40, 42, and 44 may be identical to each other in construction and operation.

The three sensors 40, 42, and 44 are spaced apart from each other on the base 30. Two of the sensors 40 and 42 are mounted on the PC board 34 at predetermined circumferential locations about the axis 32. The third sensor 44 is mounted at a location on the axis 32.

The sensors 40, 42, and 44 may be Hall effect IC's. A Hall-effect IC can be used as a proximity switch that turns ON when a magnet's south pole approaches the IC, and turns OFF when the pole recedes a predetermined distance. The sensors 40, 42, and 44 may also be magnetoresistive (MR) sensors. MR devices exhibit a measurable change in resistance in the presence of a passing magnetic field. For example, an anisotropic magnetoresistive (AMR) sensor is made of a nickel-iron thin film deposited on a silicon wafer and is patterned as a resistive strip. The properties of the AMR thin film cause it to change resistance in the presence of a magnetic field.

The movable assembly 50 includes a knob 52. The knob 52 is accessible by the driver of the vehicle and is manually engageable by the driver to operate the switch 10. The movable assembly 50 is supported on the base 30 for rotation relative to the base by support structure 54 of the base. The structure 54 is shown schematically and in phantom to aid in viewing other components. In one example, the support structure 54 includes a ferrous material to shield the sensors 40, 42, and 44 from stray magnetic fields.

The movable assembly 50 also includes a magnetic member 56 that is supported for rotation with the knob 52 about the axis 32 relative to the base 30. In the illustrated embodiment, the magnetic member 56 is a disk of a particular configuration. It should be understood that the disk 56 could have other configurations, and that the magnetic member could take forms other than the form of a disk. The disk 56 is made of a ferrous material.

Two magnetic strips 60 and 62 are mounted on the disk 56. In the illustrated embodiment, the strips 60 and 62 extend circumferentially for predetermined distances near the outer periphery of the disk 56. The second magnetic strip 62 is spaced apart circumferentially about the periphery of the disk from the first magnetic strip 60. The second magnetic strip 62 is, in the illustrated embodiment, longer than the first magnetic strip 60.

The magnetic strips 60 and 62 provide the disk 56 with circumferentially spaced areas of varying magnetic flux density. The areas of varying magnetic flux density are rotatable with the knob 52, about the axis 32, relative to the base 30.

The movable assembly 50 also includes a projecting portion 64 that is supported for rotation with the knob 52 and the disk 56, about the axis 32, relative to the base 30. The projecting portion 64 includes a magnet 66 on the end of a projecting portion 68 of the disk 56. The projecting portion 68 projects axially from the disk 56 in a direction toward the base 30 and supports the magnet 66 at a location adjacent the third sensor 44.

The lighting system 12 also includes control circuitry indicated schematically at 70. The control circuitry 70 may comprise a controller, for example in the form of a microprocessor, preferably mounted on the base 30 of the switch 10. The control circuitry 70 is electrically connected with the vehicle power supply, and with the other components of the system 12 including the switch 10, the headlamps 16, the parking lamps 18, and the fog lamps 20. The control circuitry 70 is operative to read the outputs of the sensors 40, 42, and 44 and, in response, control operation of the headlamps 16, parking lamps 18, and fog lamps 20. The control circuitry 70 may be part of the switch 10, as illustrated, or may be separate.

The movable assembly 50 has a plurality of rotational positions relative to the base 30. Each one of the rotational positions of the movable assembly 50 corresponds to a selected condition of vehicle illumination.

For example, FIG. 4 shows schematically the parts of the switch 10 in a first condition of vehicle illumination, specifically, an "Autolamp" condition. The movable assembly 50 is in a first rotational position relative to the base 30. The first magnetic strip 60 overlies the first sensor 40. The second magnetic strip 62 is spaced apart from both sensors 40 and 42. As a result, the first sensor 40 has an output state of 1 and the second sensor 42 has an output state of 0. Therefore, the control circuitry 70 sets the vehicle headlamps 16 to be energized automatically in low light conditions.

FIG. 5 shows schematically the parts of the switch 10 in a second condition of vehicle illumination, specifically, an "OFF" condition. The movable assembly 50 is in a second rotational position relative to the base 30. The first magnetic strip 60 is between and spaced apart from both sensors 40 and 42. The second magnetic strip 62 also is spaced apart from both sensors 40 and 42. As a result, both the first sensor 40 and the second sensor 42 have output states of 0. Therefore, the control circuitry 70 turns OFF the vehicle headlamps 16 and parking lamps 18.

FIG. 6 shows schematically the parts of the switch 10 in a third condition of vehicle illumination, specifically, a "Park" condition. The movable assembly 50 is in a third rotational position relative to the base 30. The first magnetic strip 60 overlies the second sensor 42. The second magnetic strip 62 is spaced apart from both sensors 40 and 42. As a result, the first sensor 40 has an output state of 0 and the second sensor 42 has an output state of 1. Therefore, the control circuitry 70 energizes the vehicle parking lamps 18.

FIG. 7 shows schematically the parts of the switch 10 in a fourth condition of vehicle illumination, specifically, an "ON" condition. The movable assembly 50 is in a fourth rotational position relative to the base 30. The first magnetic strip 60 overlies the second sensor 42. The second magnetic strip 62 overlies the first sensor 40. As a result, both the first sensor 40 and the second sensor 42 have output states of 1. Therefore, the control circuitry 70 energizes the vehicle headlamps 16.

In the position of the parts shown in FIG. 2, the knob 52 is pushed in axially, in a direction toward the base 30, so that the magnet 66 on the projecting portion 68 of the disk 56 is disposed relatively close to the third sensor 44. As a result, the third sensor 44 has an output state of 0. Therefore, the control circuitry 70 does not energize the vehicle fog lamps 20.

In the position of the parts shown in FIG. 3 the knob 52 is pulled out axially, in a direction away from the base 30. The magnet 66 on the projecting portion 68 of the disk 56 is moved a predetermined distance away from the third sensor 44. As a result, the third sensor 44 has an output state of 1. Therefore, the control circuitry 70 energizes the vehicle fog lamps 20.

FIG. 3 also illustrates an intermediate pull position in phantom at 80. In this intermediate position, the magnets 60, 62 and 66 are spaced apart from the sensors 40, 42 and 44 by third predetermined distances. The outputs of all three sensors 40, 42 and 44 change. As a result, the encoded outputs of the sensors 40, 42 and 44 comprise a third output state, in response to which the control circuitry 70 energizes the vehicle lighting system 12 in a different manner.

FIG. 8 illustrates schematically the operation of a switch 10*a* in accordance with a second embodiment of the invention. The switch 10*a* is generally similar in configuration to the switch 10 (FIGS. 1–7), and may be substituted in the lighting system 12 for the substituted in the lighting system 12 for the switch 10. Parts of the switch 10*a* (FIG. 8) that are similar or the same as parts of the switch 10 are given the same reference numerals with the suffix "a" attached.

The switch 10*a* includes a magnetic sensor 40*a* in the form of a Wiegand-effect sensor. A Wiegand-effect sensor produces a voltage pulse when a specific magnetic field impinges on it. These pulses can be detected by an electronic circuit, and used to control or identify other devices.

The switch 10*a* includes a movable assembly 50*a* having a magnetic disk 56*a*. A plurality of slots are formed in the disk 56*a*. The slots provide spaced areas of varying magnetic flux density in the disk 56*a*. Specifically, the disk 56*a* includes a group of seven closely spaced slots 82, a group of five closely spaced slots 84, a group of three closely spaced slots 86, and a single slot 88.

When the movable assembly 50*a* of the switch 10*a* is turned, the disk 56*a* rotates relative to the Wiegand-effect sensor 40*a*. The slotted areas of the disk 56*a* are movable over the sensor 40*a* to provide the switch 10*a* with a specific output to control the vehicle lighting system 12.

For example, as the group of seven slots 82 move over the sensor 40*a*, the switch 10*a* provides an output that is read by the control circuitry. The control circuitry sets the vehicle headlamps 16 to be energized automatically in low light conditions. As the group of five slots 84 move over the sensor 40*a*, the switch 10*a* provides a different output that is read by the control circuitry. The control circuitry turns OFF the vehicle headlamps 16 and parking lamps 18.

As the group of three slots 86 move over the sensor 40a, the switch 10a provides a still different output that is read by the control circuitry. The control circuitry energizes the vehicle parking lamps 18. As the single slot 88 moves over the sensor 40a, the switch 10a provides yet a different output that is read by the control circuitry. The control circuitry energizes the vehicle headlamp 16.

From the above description of the invention, those skilled in the art will perceive improvements, changes and modifications in the invention. For example, the slots 82, 84, 86, and 88 in the magnetic disk 56a of the switch 10a, which provide the areas of varying magnetic flux density, could be replaced by magnetic strips, as in the switch 10. Similarly, the magnetic strips 60 and 62 in the switch 10, which provide the areas of varying magnetic flux density, could be replaced by slots, as in the switch 10a. Such improvements, changes and modifications within the skill of the art are intended to be covered by the appended claims.

Having described the invention, I claim:

1. A switch for controlling operation of lamps of a vehicle, said switch comprising:
   a base having a sensor support surface; and
   a manually engageable assembly including a knob that is rotatable about an axis that extends perpendicular to said sensor support surface and relative to said base for controlling operation of the vehicle lamps;
   said assembly comprising a magnetic member that rotates with said knob about said axis;
   said base comprising at least one magnetic sensor mounted on said sensor support surface and control circuitry connecting said one magnetic sensor with the vehicle lamps;
   said magnetic member being rotatable about said axis into a plurality of different rotational positions relative to said one magnetic sensor to provide an output signal at said control circuitry that is indicative of the relative rotational position of said knob about said axis that extends perpendicular to said sensor support surface;
   said magnetic member being spaced apart from said one magnetic sensor to provide contactless operation of said switch.

2. A switch as set forth in claim 1 wherein said one magnetic sensor has a binary output that is variable in response to rotational movement of said magnetic member, said control circuitry being operative to read the binary output of said one magnetic sensor to provide an output signal that is indicative of the relative rotational position of said assembly thereby to control operation of the vehicle lamps.

3. A switch as set forth in claim 1 wherein said one magnetic sensor is a Hall effect sensor.

4. A switch as set forth in claim 1 wherein said one magnetic sensor is a magnetoresistive sensor.

5. A switch as set forth in claim 1 wherein said magnetic member has a plurality of portions defining areas of varying magnetic flux density on said magnetic member, said portions being movable angularly relative to said one magnetic sensor to vary the magnetic field on said one magnetic sensor.

6. A switch as set forth in claim 1 wherein said knob is movable axially relative to said base along said axis that extends perpendicular to said sensor support surface to control operation of a vehicle lighting function, said axial movement of said knob causing axial movement of said magnetic member relative to a second magnetic sensor mounted on said sensor support surface on said base to change the magnetic flux density and thereby an output state of said second magnetic sensor, said axial movement of said magnetic member being independent of any rotational movement of said magnetic member, said magnetic member being spaced apart from said second magnetic sensor to provide contactless operation between said magnetic member and said second magnetic sensor.

7. A switch as set forth in claim 1 wherein said magnetic member is a disk having circumferentially spaced areas of varying magnetic flux density that are movable circumferentially relative to said one magnetic sensor to change the magnetic flux density and thereby the output state of said one magnetic sensor;
   said magnetic member also having a portion that is movable axially relative to another magnetic sensor mounted on said sensor support surface on said base to change the magnetic flux density and thereby the output state of said other magnetic sensor, axial movement of said magnetic member relative to said other magnetic sensor being independent of rotational movement of said magnetic member.

8. A switch as set forth in claim 1 wherein said base further includes a second magnetic sensor spaced circumferentially about said axis from said one magnetic sensor, said control circuitry connecting said one magnetic said magnetic member being rotatable about said axis into a sensor and said second magnetic sensor with the vehicle lamps, plurality of different rotational positions relative to said one magnetic sensor and said second magnetic sensor.

9. A switch as set forth in claim 8 wherein each of said one magnetic sensor and said second magnetic sensor has a binary output that is variable in response to rotational movement of said magnetic member, said control circuitry being operative to read the combined binary outputs of said one magnetic sensor and said second magnetic sensor to provide an output signal that is indicative of the relative rotational position of said assembly thereby to control operation of the vehicle lamps.

10. A switch as set forth in claim 8 wherein said one magnetic sensor and said second magnetic sensor are Hall effect sensors.

11. A switch as set forth in claim 8 wherein said one magnetic sensor and said second magnetic sensor are magnetoresistive sensors.

12. A switch as set forth in claim 8 wherein said magnetic member has a plurality of portions defining areas of varying magnetic flux density on said magnetic member, said portions being movable angularly relative to said one magnetic sensor and said second magnetic sensor to vary the magnetic field on said one magnetic sensor and said second magnetic sensor.

13. A switch as set forth in claim 8 wherein said knob is movable axially along said axis that extends perpendicular to said sensor support surface and relative to said base to control operation of a vehicle lighting function, said axial movement of said knob causing axial movement of said magnetic member relative to a third magnetic sensor on said base to change the magnetic flux density and thereby an output state of said third magnetic sensor, said axial movement of said magnetic member being independent of any rotational movement of said magnetic member, said magnetic member being spaced apart from said third magnetic sensor to provide contactless operation between said magnetic member and said third magnetic sensor.

14. A switch as set forth in claim 8 wherein said magnetic member is a disk having circumferentially spaced areas of varying magnetic flux density that are movable circumferentially relative to said one magnetic sensor and said second magnetic sensor to change the magnetic flux density and the output state of said one magnetic sensor and said second magnetic sensor;

said magnetic member also having a portion that is movable axially relative to a third magnetic sensor mounted on said sensor support surface on said base to change the magnetic flux density at said third magnetic sensor thereby to change the output state of said third magnetic sensor, axial movement of said magnetic member relative to said third magnetic sensor being independent of rotational movement of said magnetic member.

15. A switch as set forth in claim 14 wherein each one of said one magnetic sensor and said second magnetic sensor has a binary output that is variable in response to rotational movement of said magnetic member, said control circuitry being operative to read the combined binary outputs of said one magnetic sensor and said second magnetic sensor to provide an output signal that is indicative of the relative rotational position of said assembly thereby to control operation of the vehicle lamps.

16. A switch as set forth in claim 1 wherein said one magnetic sensor is a Wiegand effect sensor.

17. A switch as set forth in claim 16 wherein said one magnetic sensor is fixed on said sensor support surface on said base at a predetermined angular position relative to said axis, said one magnetic member having areas of varying magnetic flux density that are movable circumferentially relative to said one magnetic sensor to vary the magnetic field on said one magnetic sensor thereby to control the output of said one magnetic sensor.

18. A switch as set forth in claim 16 wherein said knob is movable axially relative to said base to control operation of a vehicle lighting function, said axial movement of said knob causing axial movement of said magnetic member relative to a second magnetic sensor mounted on said sensor support surface on said base to change the magnetic flux density at said second magnetic sensor and thereby an output state of said second magnetic sensor, said axial movement of said magnetic member being independent of any rotational movement of said magnetic member, said magnetic member being spaced apart from said second magnetic sensor to provide contactless operation between said magnetic member and said second magnetic sensor.

* * * * *

UNITED STATES PATENT AND TRADEMARK OFFICE
CERTIFICATE OF CORRECTION

PATENT NO. : 6,659,630 B2
DATED : December 9, 2003
INVENTOR(S) : David L. Becker It is certified that error appears in the above-identified patent and that said Letters Patent is hereby corrected as shown below:

<u>Column 6,</u>
Line 25, after "magnetic" delete "said" and insert -- sensor and said second --.
Line 26, after "magnetic" insert -- sensor with the vehicle lamps, said magnetic --.
Line 27, delete "sensor and said second magnetic sensor with the vehicle lamps".

Signed and Sealed this

Twenty-eighth Day of June, 2005

JON W. DUDAS
*Director of the United States Patent and Trademark Office*